(12) United States Patent
Pan

(10) Patent No.: US 6,329,218 B1
(45) Date of Patent: Dec. 11, 2001

(54) METHOD FOR FORMING A CMOS SENSOR WITH HIGH S/N

(75) Inventor: Jui-Hsiang Pan, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/590,720

(22) Filed: Jun. 8, 2000

(51) Int. Cl.⁷ .................. H01L 21/00; H01L 21/8238
(52) U.S. Cl. ...................... 438/57; 438/199; 438/217; 438/224; 438/228
(58) Field of Search ................. 438/57, 217, 224, 438/228, 199, 237, 59–60, 73, 78, 91, 200, 210, 231, 305, 234; 257/292, 462, 446, 414, 444, 458

(56) References Cited

U.S. PATENT DOCUMENTS

| 4,611,223 | * | 9/1986 | Hine et al. ........................... 257/446 |
| 5,319,225 | * | 6/1994 | Kim ..................................... 257/223 |
| 5,716,880 | * | 2/1998 | Verma ................................. 438/200 |
| 5,945,722 | * | 8/1999 | Tsuei et al. ......................... 257/440 |
| 6,027,955 | * | 2/2000 | Lee et al. ............................. 437/57 |
| 6,033,232 | * | 3/2000 | Lin et al. ............................ 438/237 |
| 6,043,115 | * | 3/2000 | Pan ..................................... 438/199 |
| 6,090,639 | * | 7/2000 | Pan ....................................... 438/59 |
| 6,150,189 | * | 11/2000 | Pan ....................................... 438/59 |
| 6,184,557 | * | 2/2001 | Poplevine et al. ................. 257/358 |

* cited by examiner

Primary Examiner—Matthew Smith
Assistant Examiner—Chuong A Luu

(57) ABSTRACT

A method for fabricating a CMOS image sensor is disclosed. The CMOS sensor includes the portions of sensor photo-diode array NMOS and PMOS. In the method, partial steps involving implantation for image sensor fabrication are implemented at different times with the fabrication of NMOS. The method is compatible with the present process only to add a mask for patterning sensor implantation and to modify some traditional patterns of masks. The doses of the field region within the region of sensor photo-diode array can be implemented separately and are not subject to higher dopants for NMOS in the present fabrication. Thus, the doses for the sensor photo-diode array can be adjusted to meet the requirements of isolation and low dark current for the image sensor.

19 Claims, 14 Drawing Sheets

METHOD FOR FORMING A CMOS SENSOR WITH HIGH S/N

BACKGROUND OF THE INVENTION

1. Field of the Invention

The present invention relates to a method for forming a sensor, and more particularly, to a method for forming a CMOS sensor where the ion implantation within the regions of field isolation of the sensor photo-diode array is implemented separately from the ion implantation within NMOS.

2. Description of the Prior Art

Integrating photocell area-array image sensors with signal processing circuits on one chip using complementary metal oxide semiconductor (CMOS) technology is currently under heavy development for emerging multimedia applications. Presentations on this topic were included in the IEEE ISSCC conferences of '96 and '97. A variety of methods are used to form semiconductor image sensors on a substrate with CMOS devices.

The traditional process for image sensor fabrication is simultaneously completed with NMOS. As shown in FIG. 1, for a CMOS sensor consisting of the portions of sensor photo-diode array 5, NMOS 7 and PMOS 9, a semiconductor structure is provided with a semiconductor layer 100, P-epitaxial layer 110, P-well 130, N-well 120 and gate structure 150. A plurality of field regions 140 of sensor photo-diode array, bounded with P-well, are formed simultaneously with a source/drain 160 of NMOS. Thus, such a fabrication results in high impurity concentration within the region of sensor photo-diode array and the doses of ion implantation within the region of the sensor photo-diode array are as high as ones within NMOS.

However, in the region of the sensor photo-diode array, a junction that collects carriers induced by incident light, forming in a highly doped region, will result in a large capacitance. That is, the large capacitance reduces the amount of charge that can be transferred from the photo sensing element to other electronics and the detection sensitivity decreases. Furthermore, because of higher dose of field region within the region of sensor photo-diode array, it is difficult to meet the requirements of isolation and low dark current required for the image sensor.

SUMMARY OF THE INVENTION

It is an object of the present invention to provide a method for fabricating a CMOS image sensor. In the present invention, partial steps involving implantation for image sensor fabrication are implemented at different time with fabrication of NMOS. The present invention is compatible with the present process only to add a mask for patterning sensor implantation and to modify some of the traditional patterns of masks.

It is another object of the present invention to provide a method for fabricating a CMOS image sensor with a high ratio of S/N (sensitivity/dark current). The doses of the field region within the region of sensor photo-diode array can be implemented separately and are not subject to higher dopants for NMOS in present fabrication. Thus, the doses for the sensor photo-diode array can be adjusted to meet the requirements of isolation and low dark current for image sensor and a CMOS image sensor with high ratio of S/N can be implemented.

In one embodiment, a method for forming CMOS image sensor is disclosed. The method includes providing a semiconductor structure that comprises of a P-epitaxial layer on a P-type substrate. The semiconductor structure has a sensor photocell array. NMOS and PMOS. Firstly, the P-type ion is implanted into the P-epitaxial layer to form a P-well of NMOS and a plurality of isolation P-wells as isolation devides for the sensor photocell array. The N-type ion is then implanted into the P-epitaxial layer to form an N-well of PMOS and then the wells of two types are profiled by the method of drive-in. A plurality of isolation regions are formed on the surface of the P-epitaxial layer by a conventional method such as local-oxide silicon. The P-type ion is implanted into P-well of NMOS and thereafter a field channel stop and an anti-punchthrough channel are formed in P-well of NMOS. Next, a threshold voltage of CMOS is adjusted by blanket implantation of P-type ions. A plurality of gate structures that comprises a gate oxide layer and a polysilicon layer are formed on the surface of NMOS and PMOS. THe N-type ion is implanted into P-well to form LDD region of NMOS and PMOS. the N-type ion is implanted into P-well to form LDD region of NMOS and P-type ion is implanted into N-well to form LDD region of PMOS. Then a plurality of spacers are formed on the side wall of gate structures of NMOS and PMOS by the suitable methods. in P-well and N-well, the source/drain regions are formed by the individual implantation of N-type and P-type ion. The impurity concentration in LDD regions is lower than that in source/drain regions. Then the key step forming field isolation in the sensor photocell array is in the ion implantation within the sensor photocell array at a dose of approximately 1E12 to 1E13 atoms/cm2 that can both reduce the leakage and dark current of said sensor photocell array. Finally, by using the same implanting mask for forming the field isolation, the field regions in the sensor photo-diode array are implemented by N-type retrograde implantation that can reduce the peak effect around the corner of the isolation region in the sensor photocell array and simultaneously add the area of collecting incident light.

BRIEF DESCRIPTION OF THE DRAWINGS

A better understanding of the invention may be derived by reading the following detailed description with reference to the accompanying drawing wherein.

DESCRIPTION OF THE PREFERRED EMBODIMENT

Figure 1:
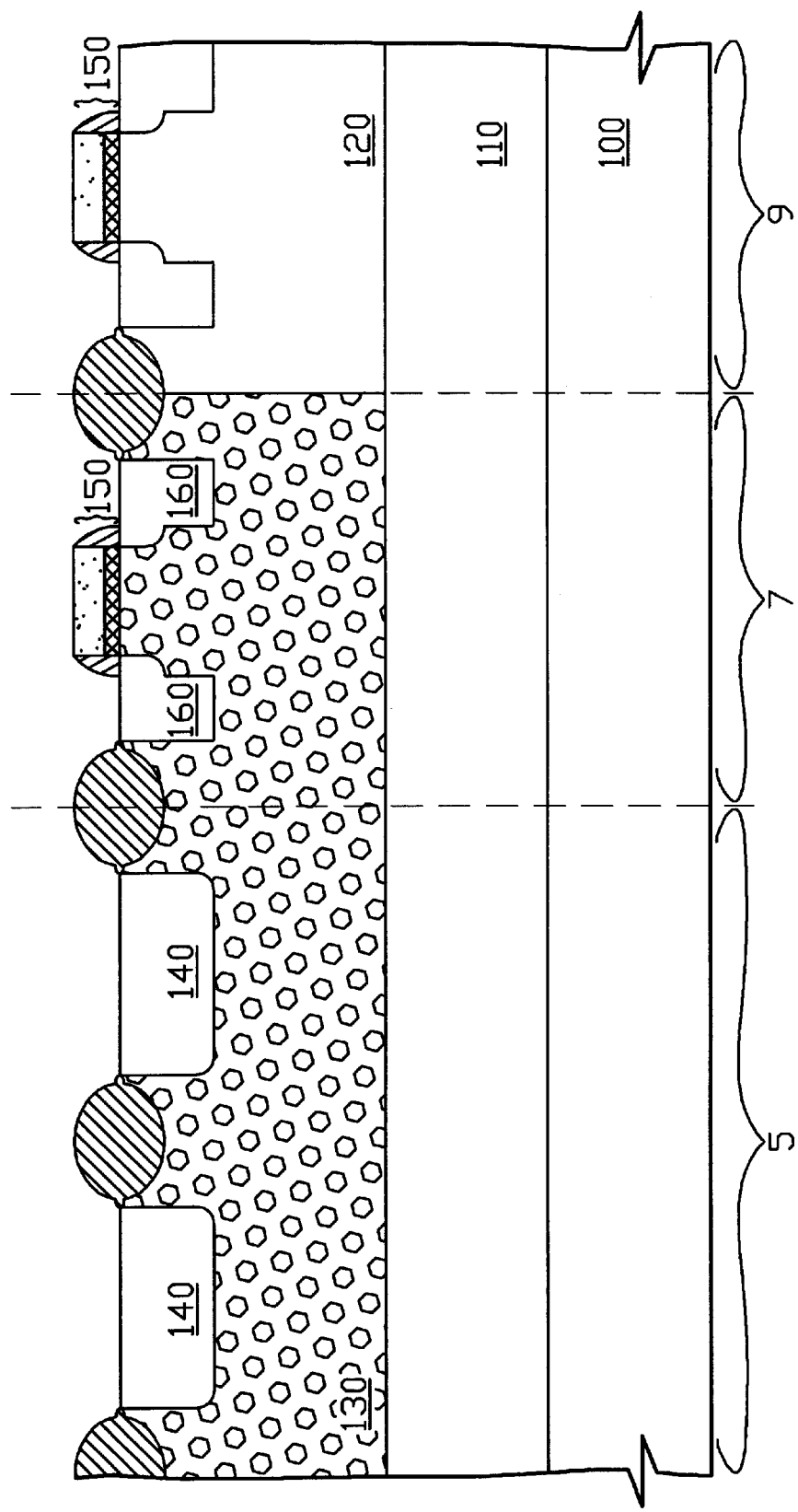
FIG. 1 presents the simplified cross-sections of a CMOS sensor being fabricated by prior art.

The semiconductor devices of the present invention are applicable to a broad range of semiconductor devices and can be fabricated from a variety of semiconductor materials. While the invention is described in terms of a single preferred embodiment, those skilled in the art will recognize that many steps described below can be altered and that species and types of substrate and dopant as well as other materials substitutions can be freely made without departing from the spirit and scope of the invention.

Furthermore, the invention allows ease of use and compatibility with bulk CMOS, and it has advantages over SOI in material quality. While the present invention is illustrated herein with CMOS, it is to be understood that the present invention is also applicable to a broad range of devices.

Furthermore, there is shown a representative portion of a semiconductor structure of the present invention in enlarged, cross-sections of the two dimensional views at several stages of fabrication. The drawings are not necessarily to scale, as the thickness of the various layers are shown for clarity of illustration and should not be interpreted in a limiting sense. Accordingly, these regions will have dimensions, including length, width and depth, when fabricated in an actual device.

In one embodiment, a method for forming a CMOS image sensor is disclosed. The method includes providing a semiconductor structure that comprises of a P-epitaxial layer on a P-type substrate. The semiconductor structure has a sensor photo-diode array, NMOS and PMOS. Firstly, the P-type ion such as isotope boron is implanted into the P-epitaxial layer to form a P-well of NMOS and a plurality of isolated P-wells as isolation devices for the sensor photo-diode array. The N-type ion such as phosphorus and arsenic is then implanted into the Pepitaxial layer to form a N-well of PMOS and then the wells of two types are profiled by the method of drive-in. A plurality of isolation regions is formed on the surface of the P-epitaxial layer a by conventional method such as local-oxide-silicon. And the P-type ion such as isotope boron is implanted into P-well of NMOS and thereafter a field channel stop and an anti-punchthrough channel are formed in P-well of NMOS. Next, the threshold voltage of CMOS is adjusted by blanket implantation of P-type ion such as isotope boron. A plurality of gate structures that comprises a polysilicon layer on a gate oxide layer are formed on the surface of NMOS and PMOS. The N type ion is implanted into P-well to form LDD region of NMOS and the P type ion is implanted into N-well to form LDD region of PMOS. Then a plurality of spacers is formed on the side wall of gate structures of NMOS and PMOS by the suitable methods such as CVD followed by anisotropic etching. In P-well and N-well, the source/drain regions are formed by the individual implantation of N type and P type ion. The impurity concentration in LDD regions is lower than that in source/drain regions. Then the key step forming field isolation in the sensor photo-diode array is the ion implantation within the sensor photo-diode array at a dose of approximately 1E12 to 1E13 atoms/cm2 that can both reduce the leakage and dark current of the sensor photo-diode array. Finally, using the same implanting mask for forming the field isolation, the field regions in the sensor photo-diode array are implemented by N type retrograde implantation that can reduce the peak effect around the corner of the isolation region in the sensor photo-diode array and simultaneously add the area of collecting incident light.

Figure 2A:
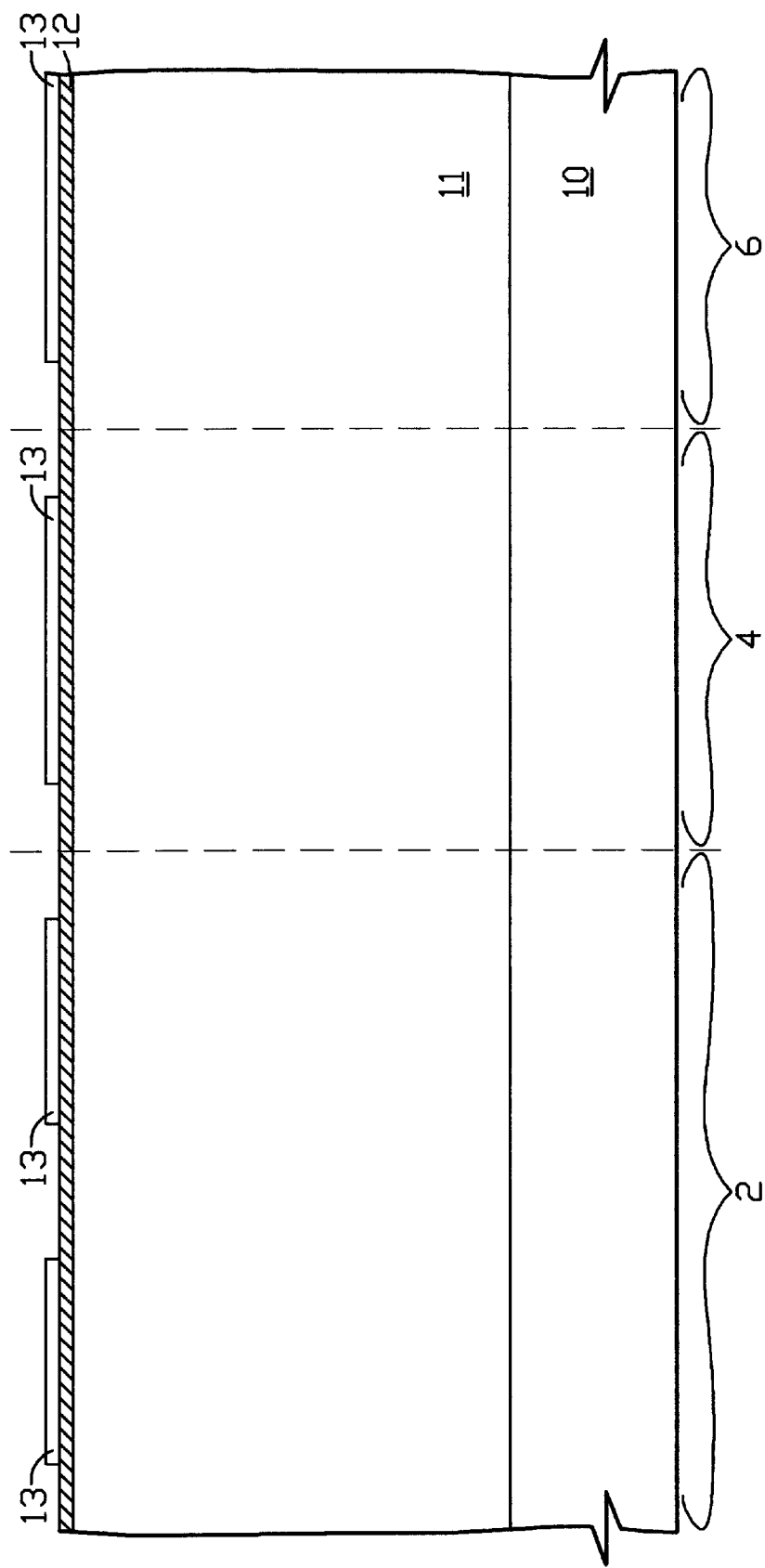
FIGS. 2A–2M show a series of cross-sections of a CMOS sensor being fabricated by the present invention.

In a preferred embodiment that consists of the portions of a sensor photo-diode array 2, an NMOS 4 and a PMOS 6, a semiconductor substrate 10 is provided having a heavily P-type dopant. A P-type epitaxial layer 11 ("P-epi"), having fewer defects than conventional silicon, is deposited on the upper surface of the substrate 10 by any conventional vapor phase epitaxial technique. A pad oxide layer 12 is then formed on the upper surface of P-epitaxial layer 11 and thereafter a dielectric layer 13, such as a nitride layer, is deposited on the upper surface of the pad oxide layer 12. The pad oxide layer 12 is formed by any conventional method such as heated in furnace and is a sacrificial oxide layer whose intent will prevent channel effect on the following ion implantation. The dielectric layer 13 is formed by any known method such as low pressure chemical vapor deposition (LPCVD) method and acts as a etching mask and masking layer. A photoresist (not shown) is formed on the dielectric layer 13 using any suitable method. A first mask pattern is transferred to the dielectric layer 13 by any known method such as dry plasma etching and the photoresist is stripped thereafter. The dielectric layer 13 is selectively left for defining field isolation regions on the upper surface of the pad oxide layer 12, as depicted in FIG. 2A.

Figure 2B:
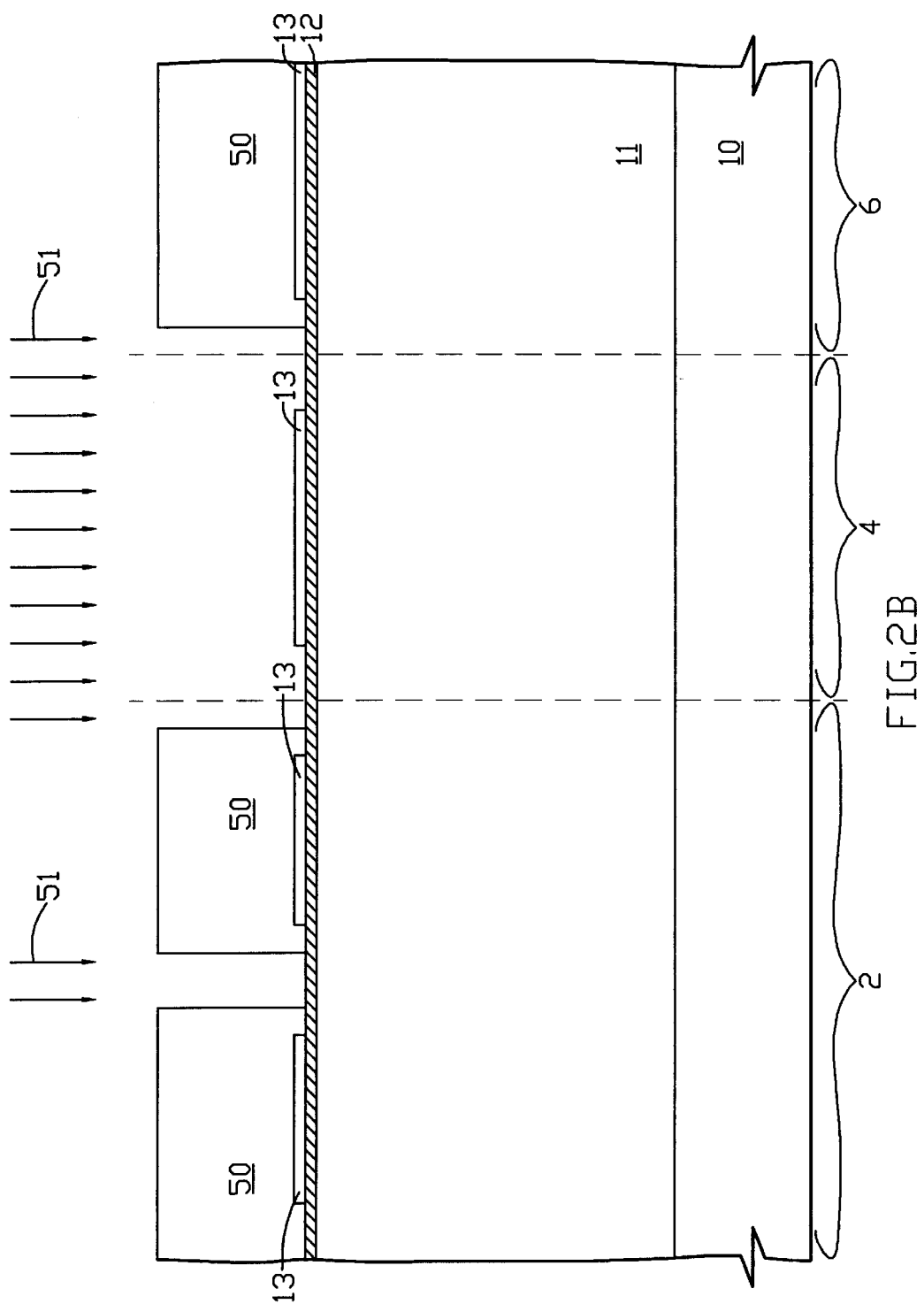

As a key step of this embodiment, in FIG. 2B, a second implant photoresist 50 is patterned to define the implanting mask for concurrently forming a P-well of the NMOS 4 and separated P-wells within the region of the sensor photo-diode array 2. By using the second implant photoresist 50, the separated P-wells are defined to act as the isolations between the pixels in the sensor photo-diode array 2, and the P-epitaxial layer 11 is used as the substrate of active regions in the sensor photo-diode array 2. A ion implant 51 such as isotope (B11) is implanted into the P-epitaxial layer 11 and then the second implant photoresist 50 is removed by any suitable method.

Figure 2C:
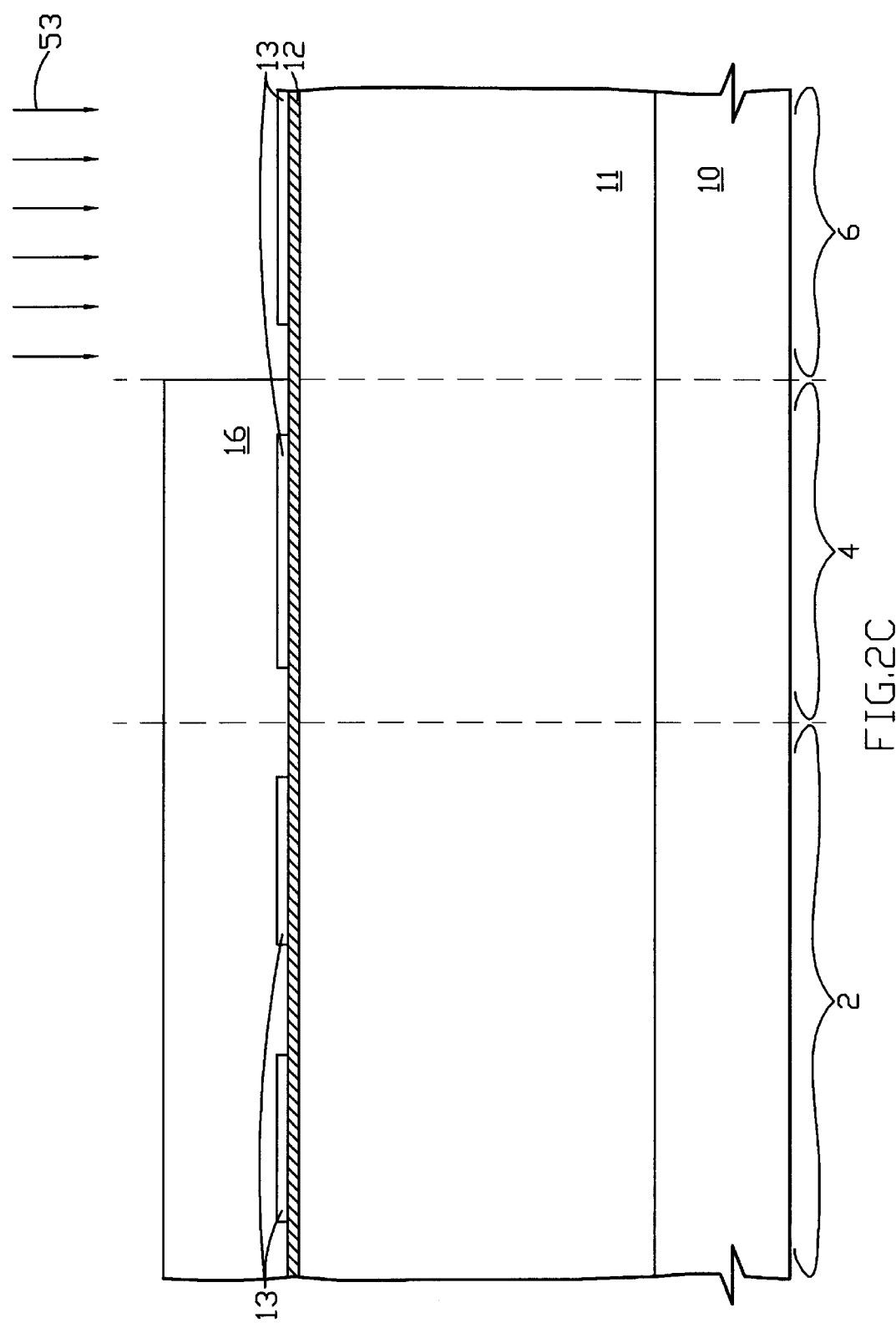

Referring to FIG. 2C, by using a third implant photoresist 16, an N-well region is defined in the PMOS 6. The N-well is formed by sequentially implanting two species of N-type dopant 53 such as phosphorus (P++) and Arsenic (As). The phosphorus dopant is deeper than the Arsenic one in P-epitaxial layer 12 because of mobility. Using different species of N-type dopant can meet with specific requirements of the electrical characteristic design.

Figure 2D:
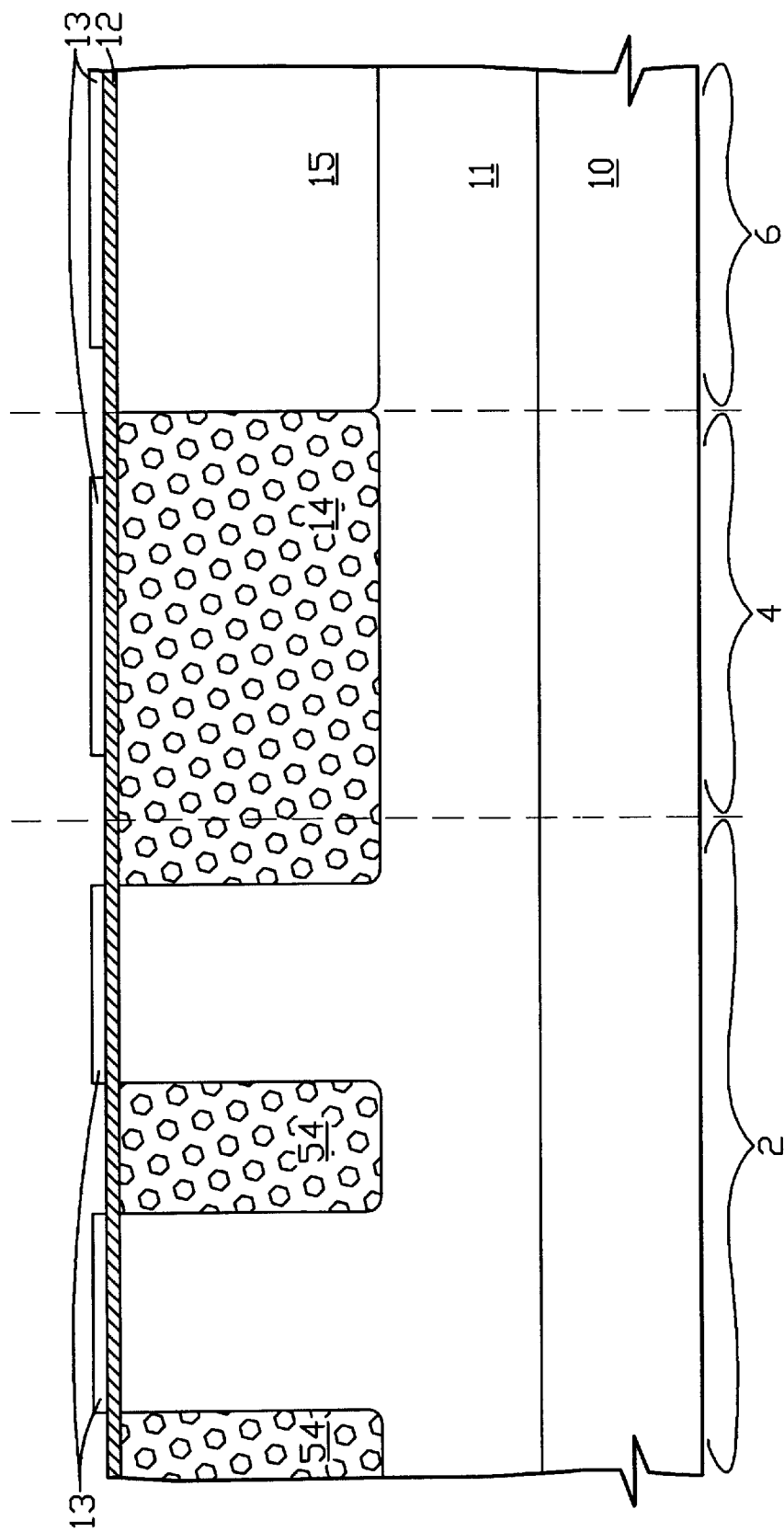

As seen in FIG. 2D, after the third implant photoresist 16 is removed by any suitable method, the wafer is placed into a furnace and the implanted ions will drive in the P-epitaxial layer 12 by high temperature diffusion. A plurality of separated P-well 54 in the sensor photo-diode array 2' a P-well 14 of the NMOS 4 and a N-well 15 of the PMOS 6 are profiled by this drive-in method mentioned above. The separated P-wells 54 act as the isolation between the pixels in the sensor photo-diode array 2 and the P-epitaxial layer 11 instead of conventional P-well is used as the substrate of active regions in the sensor photodiode array 2.

Figure 2E:
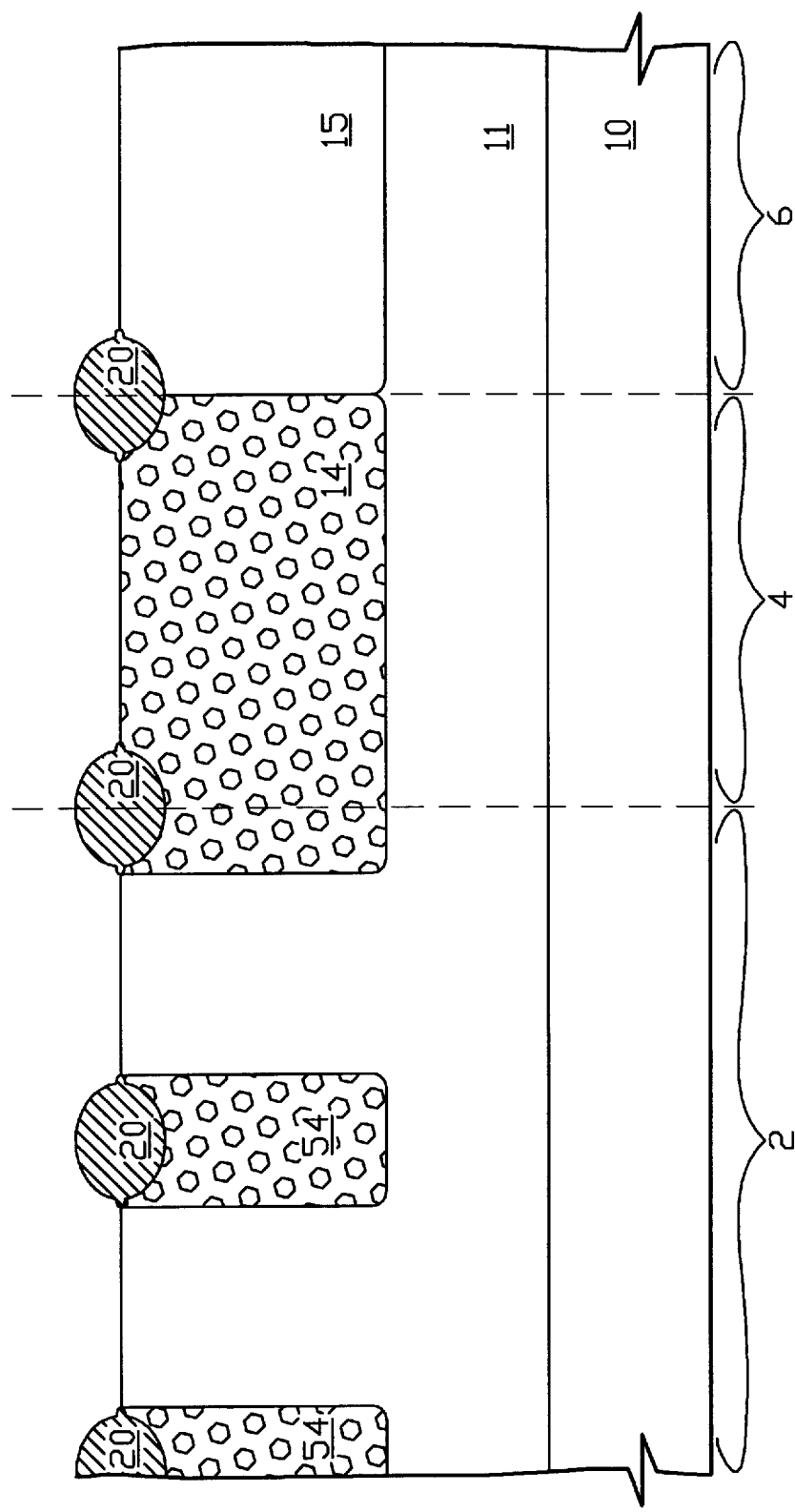
Figure 2F:
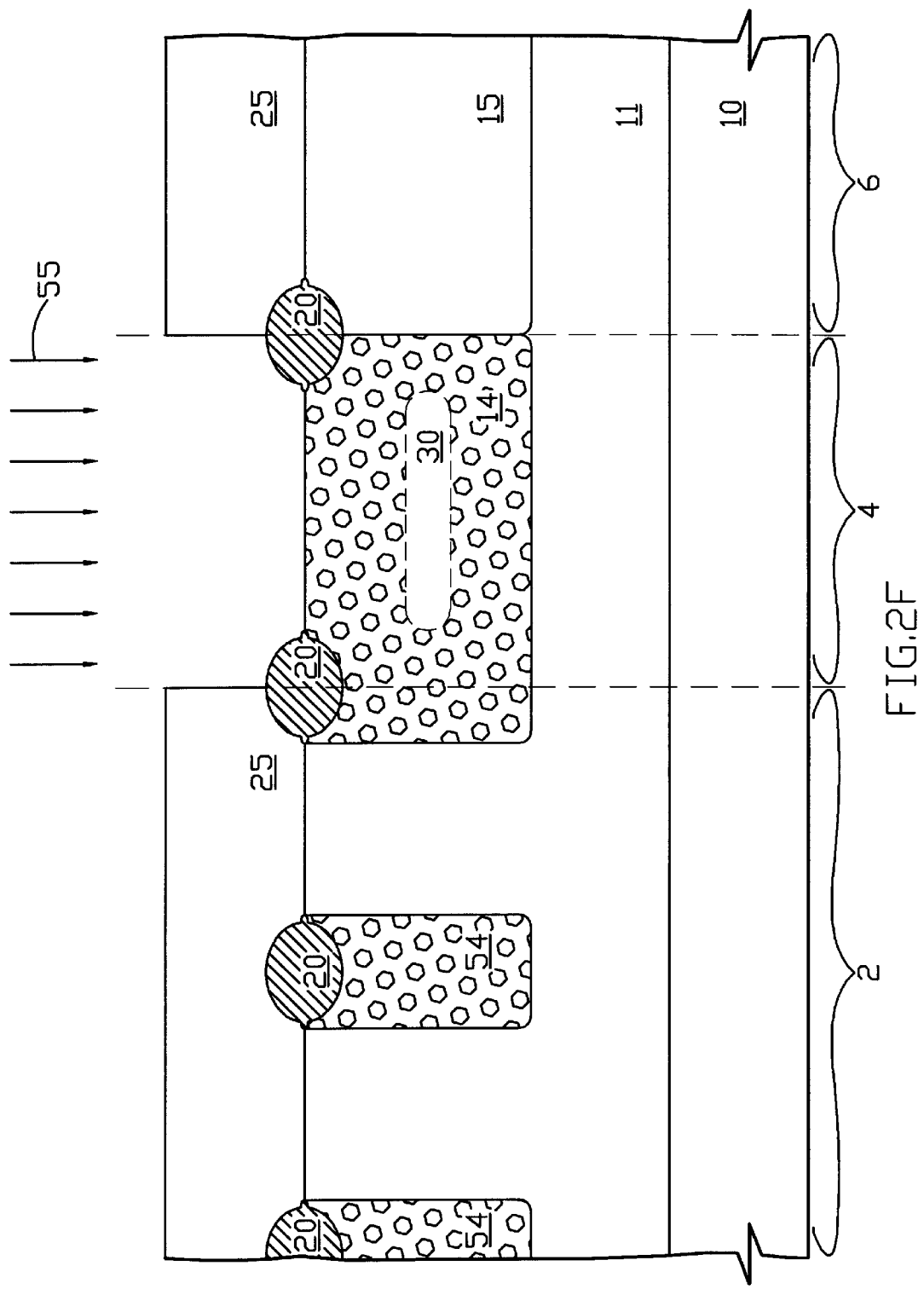

Next, the pad oxide layer 12 is removed by any suitable method. Then, the wafer is placed into a furnace and a plurality of field isolations 20 are formed on the upper surface of the P-epitaxial layer 11 by any conventional thermal oxidation such as local oxidation of silicon (LOCOS). The amounts of field isolation depend on the layout rule and line width. The dielectric layer 13 is thereafter removed by any conventional method such as cleaning by hot phosphoric acid solution, as shown in FIG. 2E As a key step of this embodiment, in FIG. 2F, a fourth implant photoresist 25 is patterned to define an implanting mask for a P-doped field channel stop and an anti-punch-through buried implant channel in the P-well 14 of NMOS 4. The fourth implant photoresist 25 protects the sensor photo-diode array 2 and PMOS 6 from ion implantation in this step. An ion implant 55 such as isotope boron is implanted into the P-well 14 of NMOS 4 and then a P-doped field channel stop and anti-punch-through buried implant channel 30 are formed in P-well 14. The fourth photoresist implant mask 25 is thereafter removed by any suitable method.

Figure 2G:
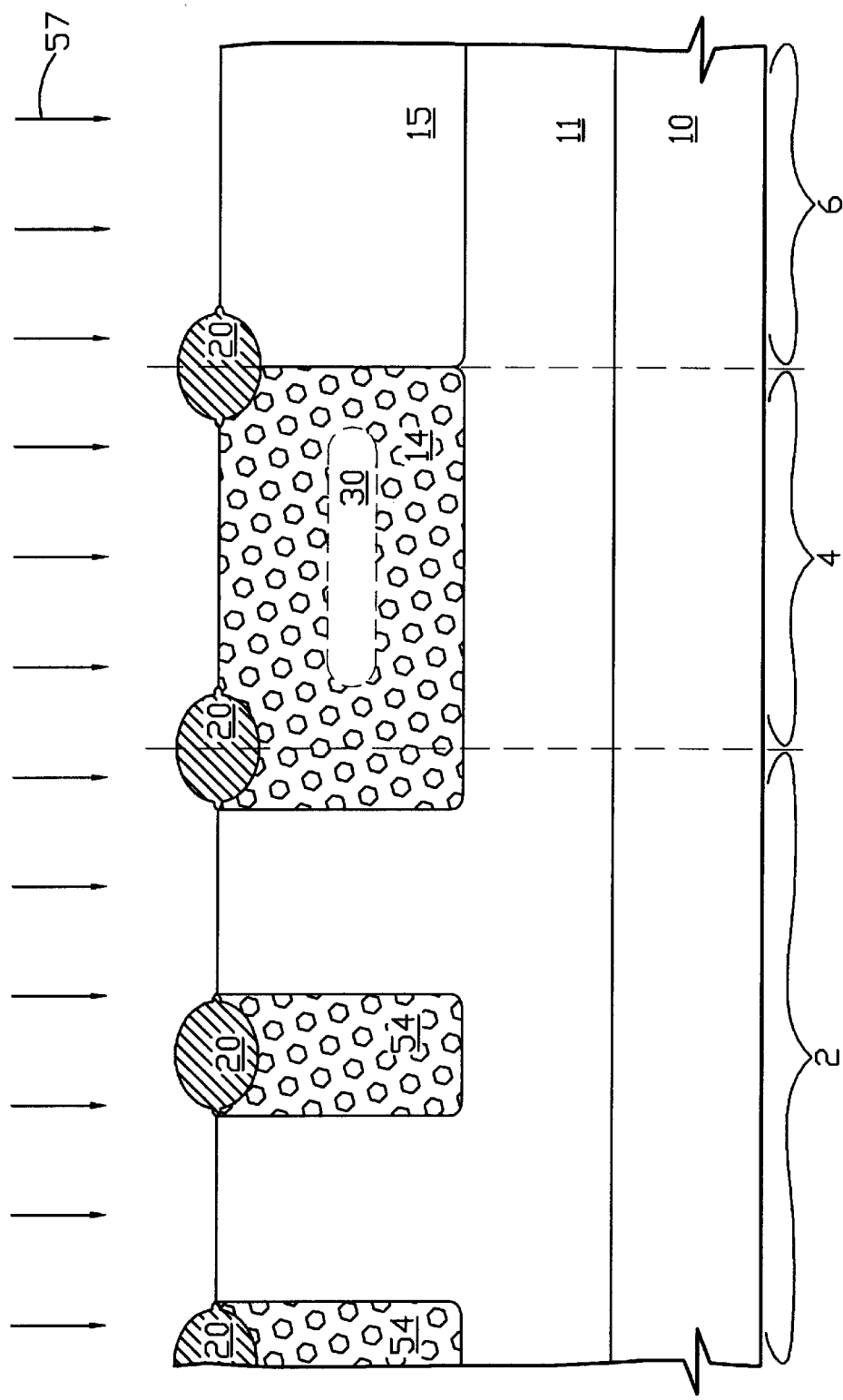

Referring to FIG. 2G, threshold voltage (Vt) is adjusted by blanket implantation of an ion implant 57 over all of surface regions. The blanket implantation provides a low level of dopant that is sufficient to stabilize the otherwise unpredictable electrical properties. The ion implant 57 such as BF2 is implanted into the sensor photo-diode array 2' NMOS 4 and PMOS 6. The implantation of ion implant 57 is at an energy of approximately 60 KeV and a dose of approximately 1E13 atoms/cm2.

Figure 2H:
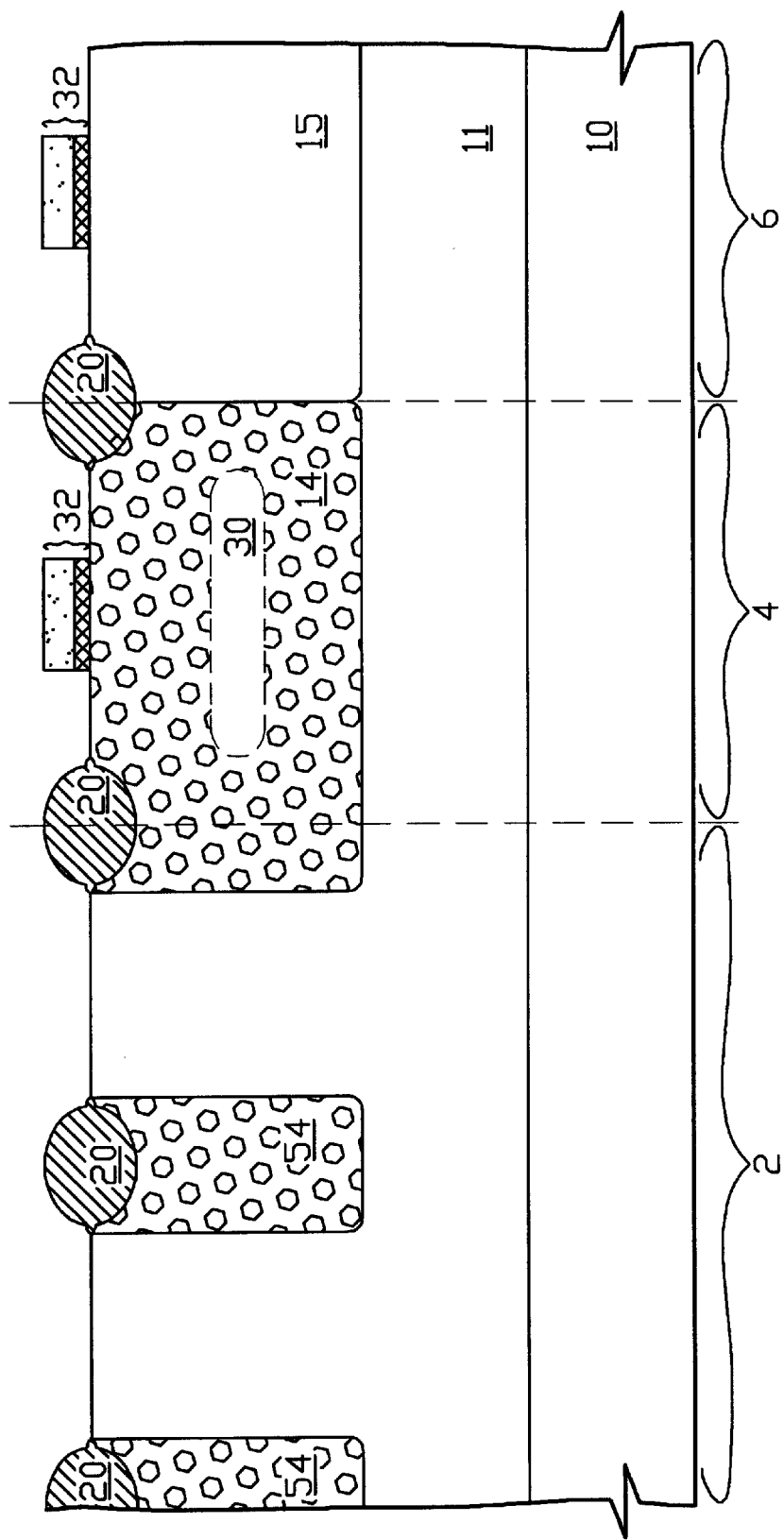

Next, a gate oxide layer is firstly formed on all of surfaces regions by any conventional thermal oxidation, and thereafter a polysilicon layer is deposited on the gate oxide layer by low pressure chemical vapor deposition (LPCVD). A plurality of gates structure 32, comprising of the polysilicon layer on the gate oxide layer, are patterned by a fifth photoresist and formed on the upper surface of the NMOS 4 and the PMOS 6, and thereafter the fifth photoresist is removed by any suitable method, as shown in FIG. 2H.

Figure 2I:
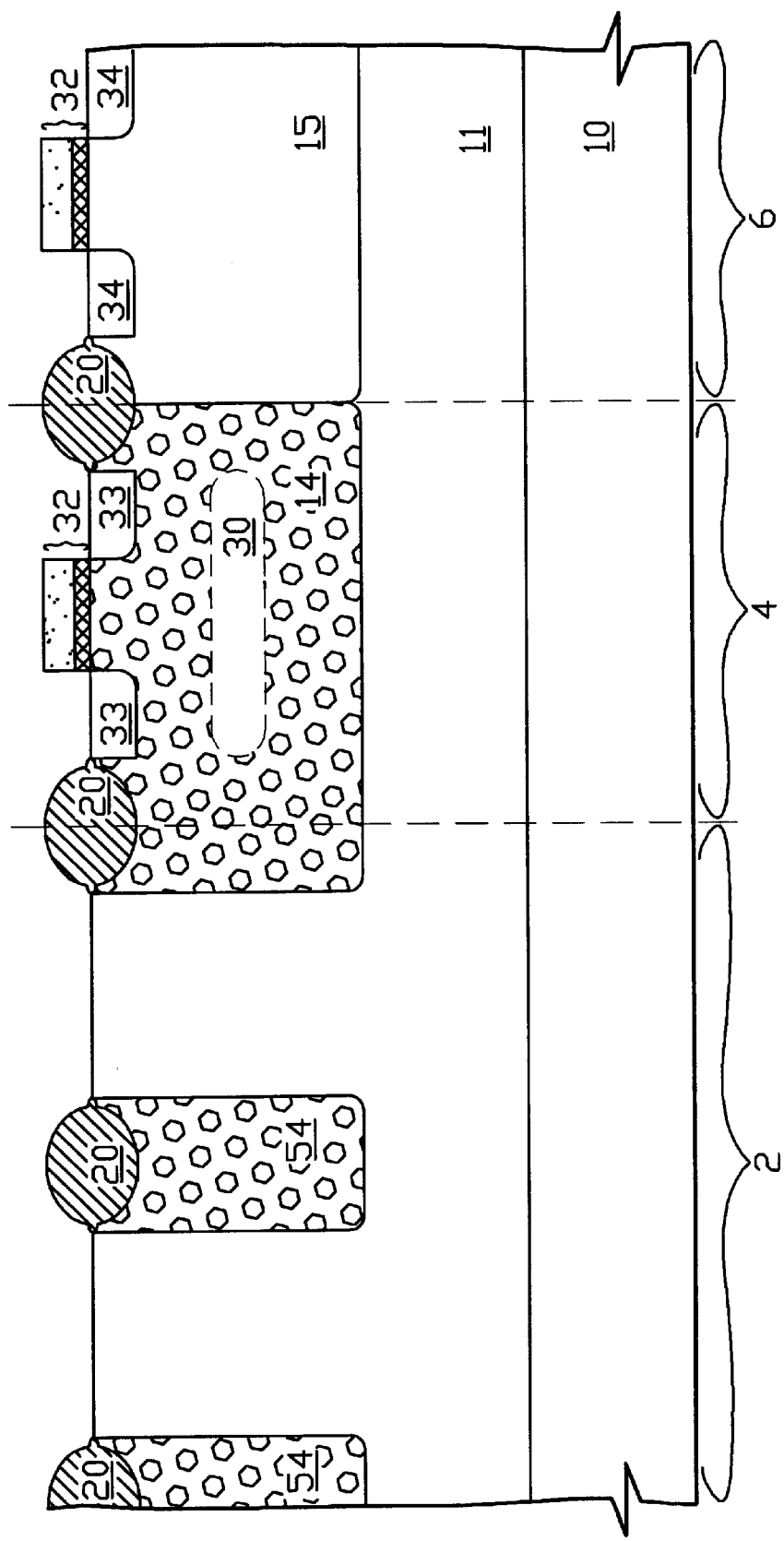

As a key step of this embodiment, sixth N-type source/drain implant photoresist is patterned to define the implanting mask for forming LDD (lightly doped drain) of the NMOS 4. The sixth implant photoresist protects the sensor photo-diode array 2 and the PMOS 6 from ion implantation. A N type dopant is implanted into the P-well 14 and the sixth implant photoresist is then removed. A plurality of N-type LDD regions 33 is formed and located at side region of the gate structure 32 below surface regions of P-well. A seventh P-type source/drain implant photoresist is patterned for forming LDD of the NMOS 6. A P dopant is implanted into the N-well 15 and a plurality of P-type LDD region 34 is located at side region of gate structure 32 below surface regions of N-well. Thereafter the seventh P-type source/drain implant photoresist is removed by any suitable method, as shown in FIG. 2I.

Figure 2J:
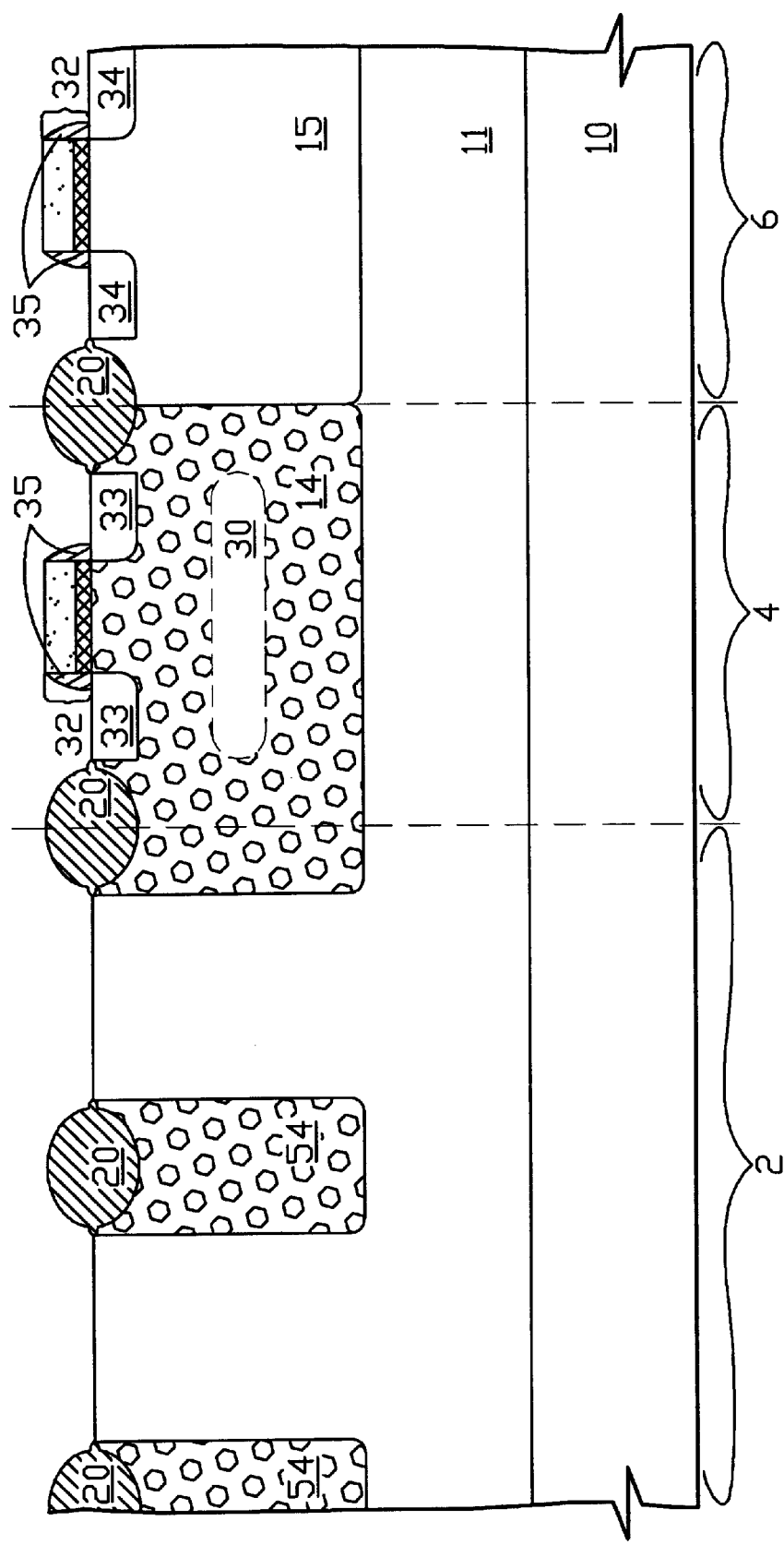

As shown in FIG. 2J, a plurality of sidewall spacers 35 is formed on the side wall of the gate structure 32. A silicon oxide layer is first deposited by a known method such as CVD and thereafter shaped by any suitable methods such as anisotropic etching, and the spacers 35 are formed on the side wall of the gate structure 32.

Figure 2K:
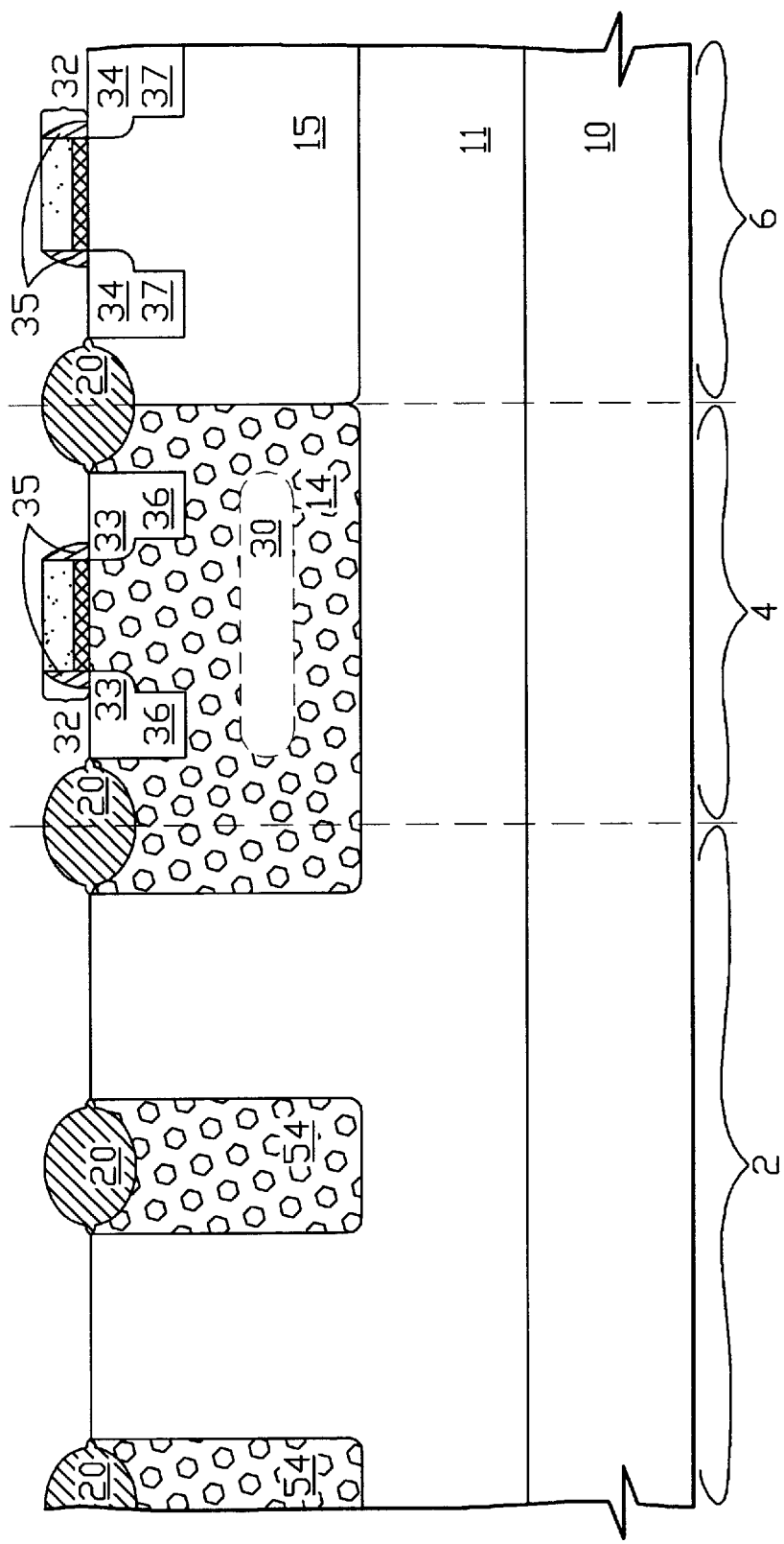

The same implanting masks used in forming LDD regions of PMOS 6 and NMOS 4 are patterned to define an implanting mask for individually forming HDD (heavily doped drain) regions of PMOS 6 and NMOS 4. A plurality of N type sources/drains 36 and P type sources/drains 37 are depicted as shown in FIG. 2K. Because the region of sensor photo-diode array 2 is protected from implanting during forming LDD and HDD regions of both the PMOS 6 and the NMOS 4, the photoelectric characteristics of the sensor photo-diode array 2 is not subjected to the ion implantation for NMOS 4 and has a good ratio of sensitivity and dark current.

Figure 2L:
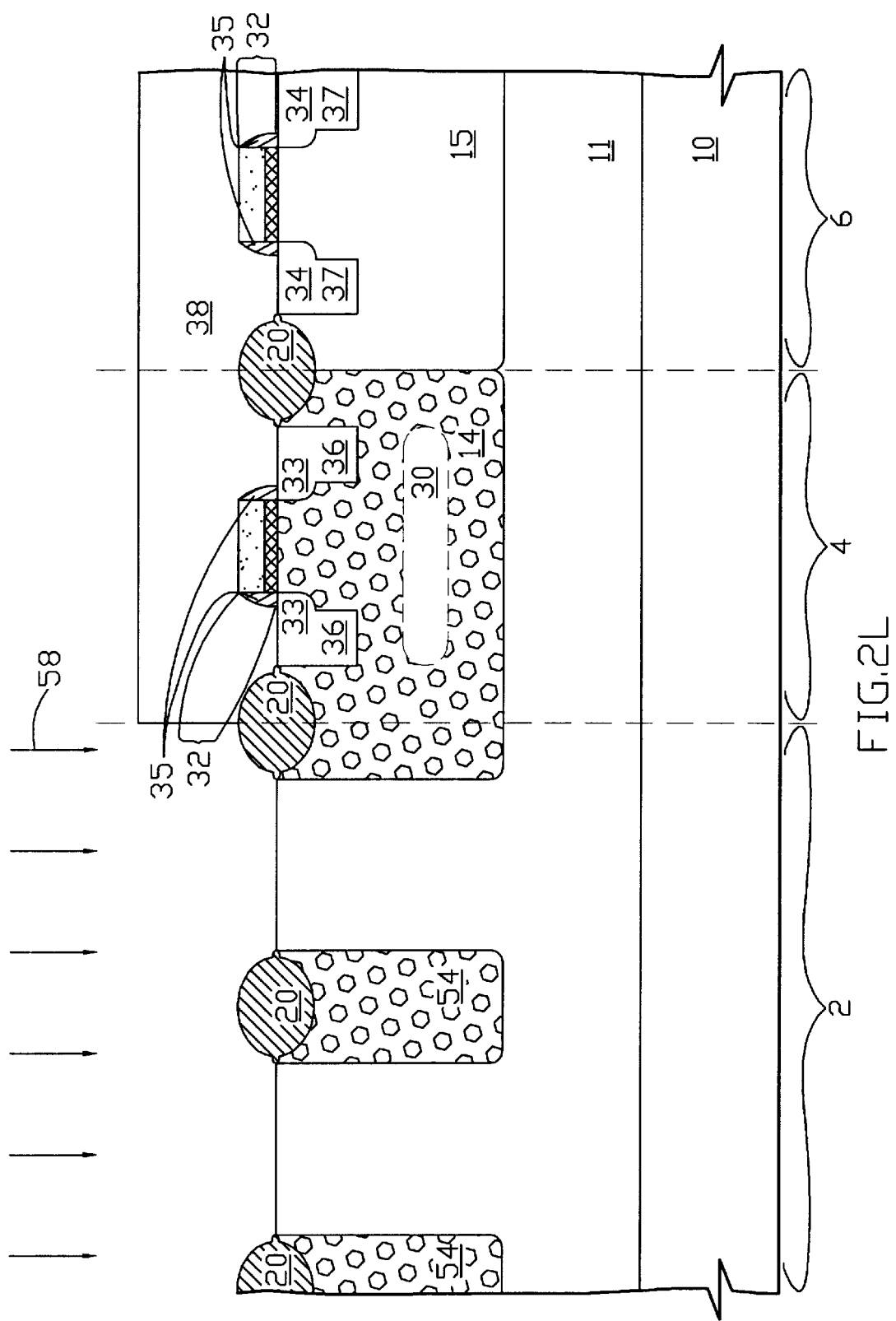

As a key step of this embodiment, in FIG. 2L, an eighth sensor implant photoresist 38 is patterned to define an implanting mask for forming field isolation in sensor photo-diode array. A dopant 58 with a dose of approximately 1E12 to 1E13 atoms/cm$^2$ is implanted in the P-epitaxial layer 11 of the sensor photo-diode array 2. Because of less damage on the isolation effect for the sensor photo-diode array 2, the low dose controlled within 1E12 and 1E13 atoms/cm$^2$ can have applicable isolation effects between pixel and pixel and simultaneously reduce dark current. Furthermore, the ion implantation also can reduce leakage in the sensor photo-diode array 2.

Figure 2M:
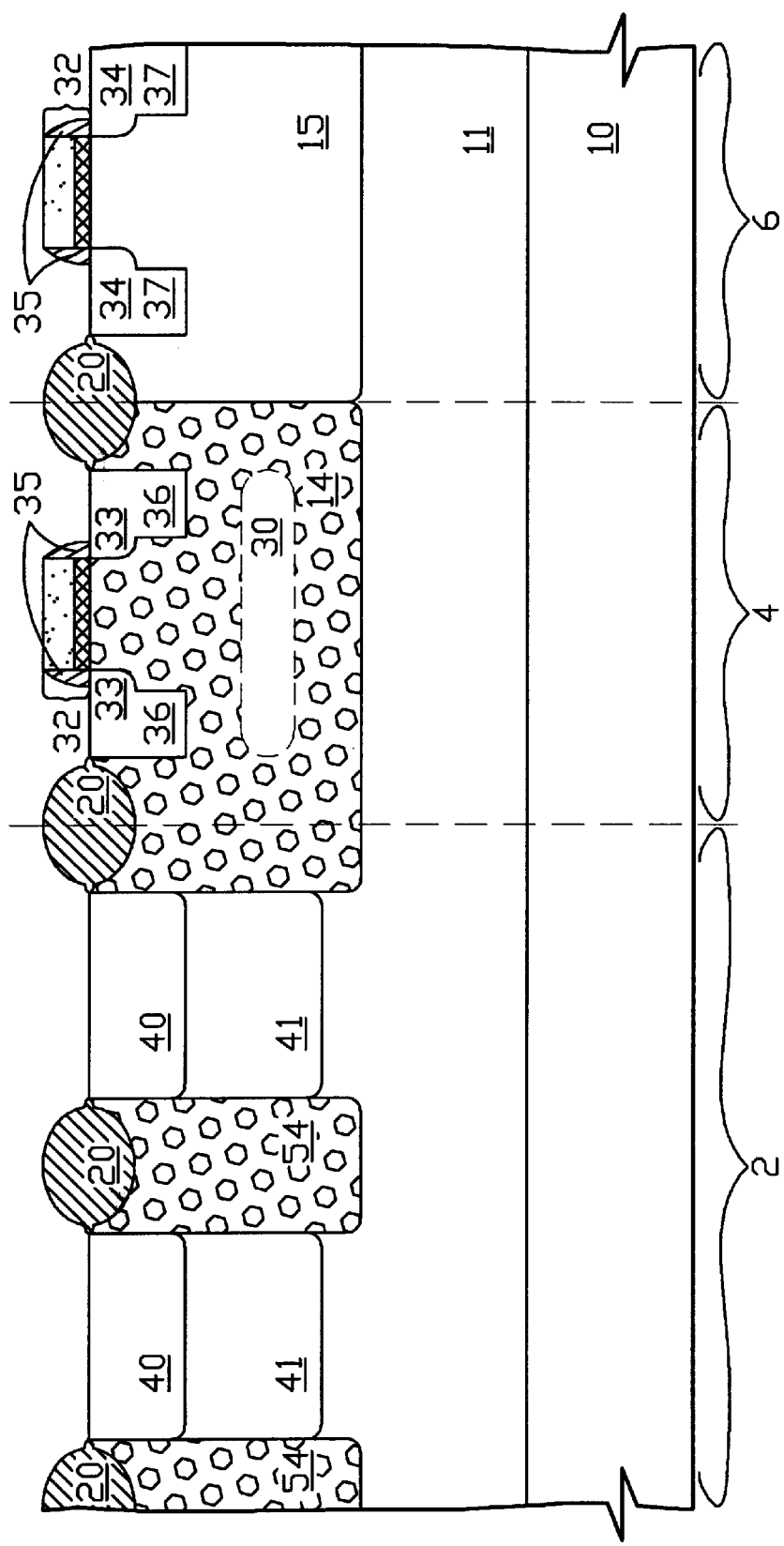

Referring to FIG. 2M, with retrograde implantation in the sensor photo-diode array 2, thereafter N type field region is profiled by implanting dopant such as As. The N ion implant is deeply implanted into the P-epitaxial layer 11 at an energy of approximately 30 eV and thereafter sensor mask 38 is removed. An N-type field region 40 with heavy concentration and a N type field region 41 with light concentration in the sensor photo-diode array 2 can reduce the effect of electro-field peak at field oxide corner region and simultaneously add the area of epi-junction collecting incident light. Besides, the depletion capacitance between the N type field region 41 and P-epitaxial layer 11 is small far away one between the N type field channel and the P-well that is formed by conventional methods. That is, depletion region formed by the invention can improve the sensitivity of the sensor photo-diode array 2 and the ratio of S/N. Thus, the CMOS sensor with high ratio of S/N is formed by the preferred process.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for fabricating an image sensor, said method comprising:

providing a substrate;

in-situ forming a first well and a second well of a first conductivity type in said substrate, wherein said first well is in a sensor photocell array region, and said second well is for a first metal oxide semiconductor adjacent to said sensor photocell array;

forming a third well of a second conductivity type in said substrate, wherein said third well is for a second metal oxide semiconductor adjacent to said first metal oxide semiconductor and opposite to said sensor photocell array region;

in-situ forming a first isolation device on said first well, a second isolation device between said sensor photocell array region and said first metal oxide semiconductor, and a third isolation device between said first metal oxide semiconductor and said second metal oxide semiconductor;

subsequently completely forming said first metal oxide semiconductor structure and said second metal oxide semiconductor structure;

ion-implanting of said second conductivity type into said sensor photocell array region to form a forth well in said sensor photocell array region; and ion-implanting of said second conductivity type into said sensor photocell array region to form a fifth well in said sensor photocell array region, wherein said fifth well is on the surface of said substrate and in said forth well, and the concentration of said fifth well is heavier than said forth well.

2. The method according to claim 1, wherein said substrate further comprises an epitaxial silicon layer thereon.

3. The method according to claim 1, wherein said sensor photocell array comprises sensor photo-diode array.

4. The method according to claim 1, wherein all said isolation devices are field oxidation regions.

5. The method according to claim 1, wherein said first MOS structure and said second metal oxide semiconductor structure comprise a gate oxide layer, a gate electrode, two lightly-doped drain regions, spacers, a source region, and a drain region.

6. The method according to claim 1, further comprising an ion-implanting step to adjust the threshold voltage of said first metal oxide semiconductor structure and said second metal oxide semiconductor structure.

7. A method for fabricating a metal oxide semiconductor image sensor, the method comprising:

providing a semiconductor structure having a sensor photocell array, a first type metal oxide semiconductor and a second type metal oxide semiconductor;

ion-implanting a second type dopant into said substrate structure of said second type to form a first well in said first type metal oxide semiconductor and a second well as an isolation device for said sensor photocell array;

ion-implanting a first type dopant into said substrate structure of said second conductivity type of form a third well in said second type metal oxide semiconductor;

forming a first isolation region on the surface of said semiconductor structure;

ion-implanting said second type dopant into said first well to form a first field channel stop and a first anti-punch-through channel;

forming sequentially a gate structure on said first type metal oxide semiconductor and said second type metal oxide semiconductor;

ion-implanting said first type dopant into said first well to form a first lightly doped drain region of said first type metal oxide semiconductor and thereafter ion-implanting said second type dopant into said third well to form a second lightly doped drain region of said second type metal oxide semiconductor;

forming a plurality of spacers on the side walls of said gate structures;

ion-implanting said first type dopant into said first well to form a first source/drain of said first type metal oxide semiconductor and thereafter ion-implanting said second type dopant into said third well to form a second source/drain of said second type metal oxide semiconductor;

ion-implanting said first type dopant into said sensor photocell array to form a first field isolation; and ion-implanting said first type into said sensor photocell array to a first field region.

8. The method according to claim 7, wherein said first type metal oxide semiconductor is N-type metal oxide semiconductor.

9. The method according to claim 7, wherein said second type metal oxide semiconductor is P-type metal oxide semiconductor.

10. The method according to claim 7, wherein said sensor photocell array comprises of sensor photo-diode array.

11. The method according to claim 7, wherein said semiconductor structure comprises of a P-epitaxial layer on P-type substrate.

12. The method according to claim 7, wherein said first type dopant is N type selected from the fifth group consisting of phosphorus and arsenic.

13. The method according to claim 7, wherein said second type dopant is P type selected from the third group consisting of boron and boron fluoride.

14. The method according to claim 7, wherein said first well and said second well are P-well and a plurality of said second wells are separated in said sensor photocell array.

15. The method according to claim 7, wherein said third well is N-well and is profiled by drive-in.

16. The method according to claim 7, wherein said gate structure comprises of a polysilicon layer on a gate oxide layer.

17. The method according to claim 7, wherein said field isolation in said sensor photocell array has a key ion dose of approximately 1E12 and 1E13 atoms/cm2 that can both reduce the leakage and dark current of said sensor photocell array.

18. The method according to claim 7, wherein said field region is formed by N type ion retrograde implantation that can reduce the peak effect around the corner of said isolation region in said sensor photocell array and simultaneously add the area of collecting incident light.

19. The method according to claim 7, wherein said first field isolation and said first field region are formed by the same ion implanting mask.

* * * * *